United States Patent
Zhao et al.

(10) Patent No.: US 10,950,298 B1
(45) Date of Patent: Mar. 16, 2021

(54) MIXED THRESHOLD VOLTAGE MEMORY ARRAY

(71) Applicant: Taiwan Semiconductor Manufacturing Company, Ltd., Hsinchu (TW)

(72) Inventors: Wei-Chang Zhao, Hsinchu (TW); Hidehiro Fujiwara, Hsin-chu (TW); Chih-Yu Lin, Taichung (TW)

(73) Assignee: TAIWAN SEMICONDUCTOR MANUFACTURING COMPANY, LTD.

( * ) Notice: Subject to any disclaimer, the term of this patent is extended or adjusted under 35 U.S.C. 154(b) by 0 days.

(21) Appl. No.: 16/745,749

(22) Filed: Jan. 17, 2020

(51) Int. Cl.
*G11C 11/41* (2006.01)
*G11C 11/419* (2006.01)
*G11C 8/08* (2006.01)
*G11C 8/16* (2006.01)
*G11C 7/12* (2006.01)

(52) U.S. Cl.
CPC .............. *G11C 11/419* (2013.01); *G11C 7/12* (2013.01); *G11C 8/08* (2013.01); *G11C 8/16* (2013.01)

(58) Field of Classification Search
CPC ......... G11C 14/0054; G11C 7/12; G11C 8/08; G11C 8/16
See application file for complete search history.

(56) References Cited

U.S. PATENT DOCUMENTS

| | | | |
|---|---|---|---|
| 6,768,144 B2 | 7/2004 | Houston et al. | |
| 2008/0159014 A1* | 7/2008 | Dray | G11C 11/413 365/189.09 |
| 2014/0191328 A1 | 7/2014 | Tsuruta et al. | |
| 2015/0380078 A1* | 12/2015 | Liaw | G11C 11/419 365/156 |
| 2020/0251476 A1 | 8/2020 | Chang et al. | |

FOREIGN PATENT DOCUMENTS

DE 10 2019 121 626 A1 8/2020

* cited by examiner

*Primary Examiner* — Han Yang
(74) *Attorney, Agent, or Firm* — Merchant & Gould P.C.

(57) ABSTRACT

A static random access memory (SRAM) device includes a first memory array including a plurality of memory cells, each memory cell including a first pass gate transistor with a first threshold voltage connected to a bit line. The SRAM device further includes a second memory array including a plurality of memory cells, each memory cell including a second pass gate transistor with a second threshold voltage connected to the bit line. The SRAM device further includes a peripheral input-output circuit connected to the bit line. The SRAM device still further includes a column of write current tracking cells, each tracking cell disposed within a row of the first memory array and the second memory array, wherein the first memory array is between the peripheral input-output circuit and the second memory array.

20 Claims, 9 Drawing Sheets

MIXED THRESHOLD VOLTAGE MEMORY ARRAY

BACKGROUND

A common type of integrated circuit memory is a static random access memory (SRAM) device. A typical SRAM memory device has an array of memory cells. In some examples, each memory cell uses six transistors connected between an upper reference potential and a lower reference potential (typically ground) such that one of two storage nodes can be occupied by the information to be stored, with the complementary information stored at the other storage node. Each bit in the SRAM cell is stored on four of the transistors, which form two cross-coupled inverters. The other two transistors are connected to the memory cell word line to control access to the memory cell during read and write operations by selectively connecting the cell to its bit lines. When the word line is enabled, a sense amplifier connected to the bit lines senses and outputs stored information. Input/output (I/O) circuitry connected to the bit lines are often used when processing memory cell data. Such circuitry is often located in periphery areas that are outside of, and peripheral to, the area of the array of memory cells. There is a larger voltage drop on the bit lines of a memory array for memory cells that are located farther from the I/O circuitry, causing a lower write current and difficulty in writing to those cells as compared to memory cells that are located nearer to the I/O circuitry in the memory array.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
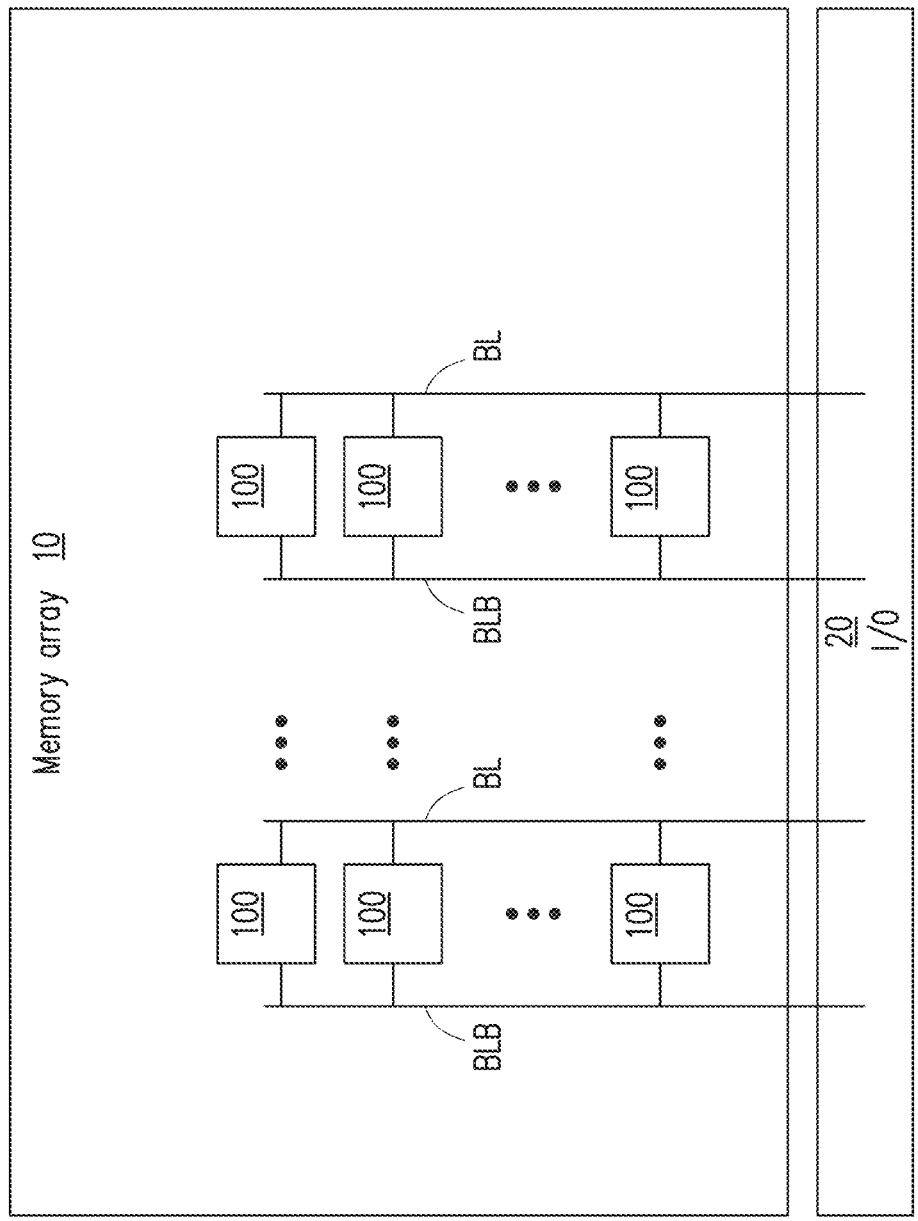
FIG. 1 is a block diagram illustrating an example of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A static random access memory (SRAM) device has an array of memory cells that include transistors connected between an upper reference potential and a lower reference potential such that one of two storage nodes can be occupied by the information to be stored, with the complementary information stored at the other storage node. For example, one typical SRAM memory cell arrangement includes six transistors. Each bit in the SRAM cell is stored on four of the transistors, which form two cross-coupled inverters. The other two transistors are connected to the memory cell word line to control access to the memory cell during read and write operations by selectively connecting the cell to its bit lines.

In a read operation, for example, the memory cell bit lines are precharged to a predefined threshold voltage. When the word line is enabled, a sense amplifier connected to the bit lines senses and outputs stored information. In some examples, data on the bit line is latched, and the latch is set to maintain the bit line output for a sufficient time period to allow for input-output (I/O) operations to occur.

In a write operation, the memory cell bit lines are set to a voltage corresponding to the value to be stored, for example, a 0 or 1. The bit line input-drivers are stronger than the transistors in the cell such that when the word line is enabled, the write voltage overrides the cross-coupled inverter values of the cell and the new value is written. Consequently, the gate transistors connecting the transistors comprising the cross-coupled inverters of the cell are stronger as well, requiring a certain voltage, equal to or greater than the threshold voltage of the gate transistors (Vth), to be applied to the word line to allow access to the memory cell. In general, gate transistors formed with lower Vth have an increased write margin, but also suffer from increased current leakage relative to gate transistors formed with a higher threshold voltage. Gate transistors formed with higher Vth suffer less current leakage, but have a decreased write margin.

Often, the input-output (I/O) circuitry apply voltages to the bit lines to read and write data to the cells is located in regions that are peripheral to the cell array. Because the conductive word and bit lines have some resistance, the voltage on those lines is lower at memory cell locations farther away from the I/O circuitry relative to memory cell locations nearer to the I/O circuitry. As such, the read speed and write margin for these "far side" memory cells may both be decreased. Reducing the Vth of the far side memory cell gate transistors can increase the read speed and write margin of those cells. Embodiments disclosed herein are directed towards changing the Vth of the gate transistors of cells in an array in proportion to the distance of the cells from the I/O circuitry driving read/write operations to compensate for the voltage drop along the bit lines, the voltage drop along the bit lines typically being caused by the intrinsic resistance of the bit lines.

In some embodiments, strap cells, or "straps," are used to separate cells in an array having different Vth. In some embodiments, the use of strap cells can reduce manufacturing constraints associated with forming memory cells with varying Vth. For example, the tolerances of the alignment of masks during doping of the layer in the active region at the gate contact can be relaxed with the use of strap cells as opposed to varying the Vth of the gate transistors in adjacent cells.

In addition to separating memory cells having varying Vth, straps may also serve as pick-up areas formed with circuits to facilitate the access operation of memory cells. Straps can also be utilized to prevent latch-up, e.g. parasitic structures disrupting the functioning of the cell. As such, the use of straps to separate cells having different Vth does not require additional area.

FIG. 1 is a block diagram illustrating an example of a memory device 1 in accordance with some embodiments. In the example shown, the memory device 1 includes a memory array 10, the memory array 10 including a plurality of memory cells 100, or bit-cells The memory device 1 also includes a periphery region 20 located peripherally to memory array 10. One or more peripheral circuits including an I/O circuit may be located in the periphery region 20. The memory cell 100 and the periphery circuits may be coupled by complementary bit lines BL and BLB, and data can read from and written to the memory cells 100 via the complementary bit lines BL and BLB.

Figure 2:
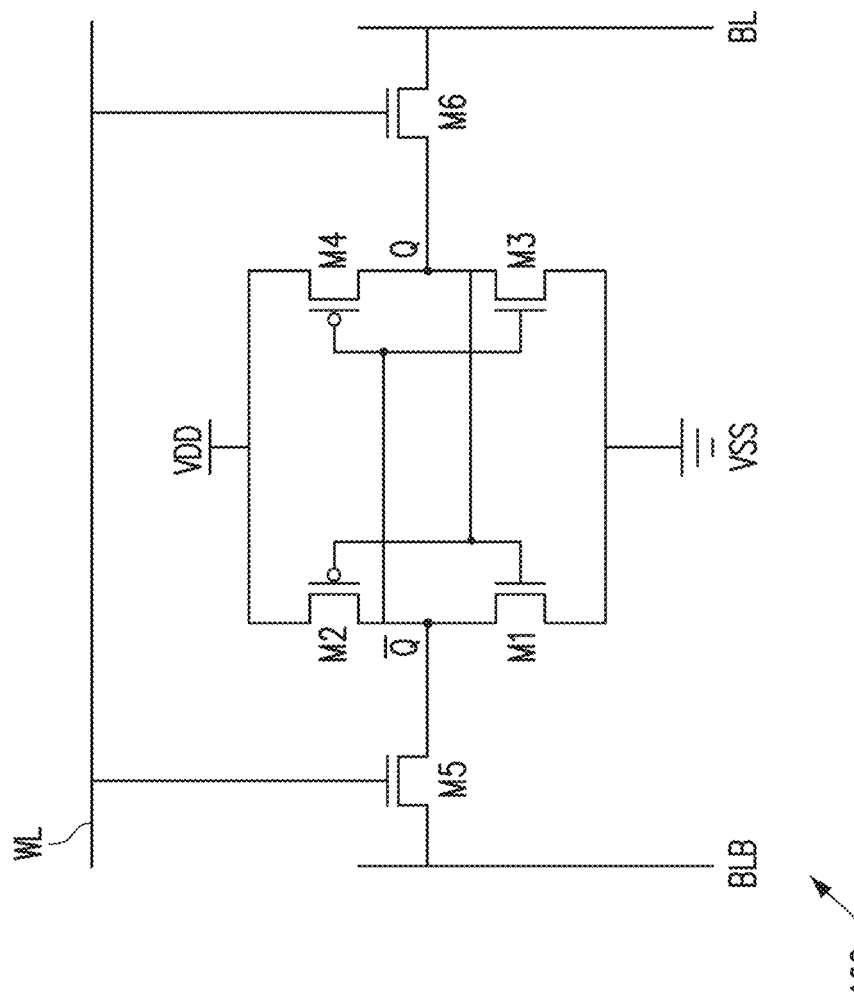
FIG. 2 is a circuit diagram illustrating an example memory cell in accordance with some embodiments.

FIG. 2 is a circuit diagram illustrating an example memory cell 100 in accordance with some embodiments. The memory cell 100 includes but is not limited to a six-transistor (6 T) SRAM structure. In some embodiments more or fewer than six transistors may be used to implement the memory cell 100. For example, the memory cell 100 in some embodiments may use a 4 T, 8 T or 10 T SRAM structure, and in other embodiments may include a memory-like bit-cell or a building unit. The memory cell 100 includes a first inverter formed by a NMOS/PMOS transistor pair M1 and M2, a second inverter formed by a NMOS/PMOS transistor pair M3 and M4, and access transistors/pass gates M5 and M6. Transistors M1, M3, M5 and M6 include n-type metal-oxide-semiconductor (NMOS) transistors, and transistors M2 and M4 include p-type metal-oxide semiconductor (PMOS) transistors.

The first and second inverters are cross coupled to each other to form a latching circuit for data storage. A first terminal of each of transistors M2 and M4 is coupled to a power supply VDD, while a first terminal of each of transistors M1 and M3 is coupled to a reference Voltage VSS, for example, ground.

A gate of the pass gate transistor M6 is coupled to a word line WL. A drain of the pass gate transistor M6 is coupled to a bit line BL. Moreover, a first terminal of the pass gate transistor M6 is coupled to second terminals of transistors M4 and M3 and also to gates of M2 and M1 at the node Q.

Similarly, a gate of the pass gate transistor M5 is coupled to the word line WL. A drain of the pass gate transistor M5 is coupled to a complementary bit line BLB. Moreover, a first terminal of the pass gate transistor M5 is coupled to second terminals of transistors M2 and M1 and also to gates of transistors M4 and M3 at the node Qbar.

Figure 3:
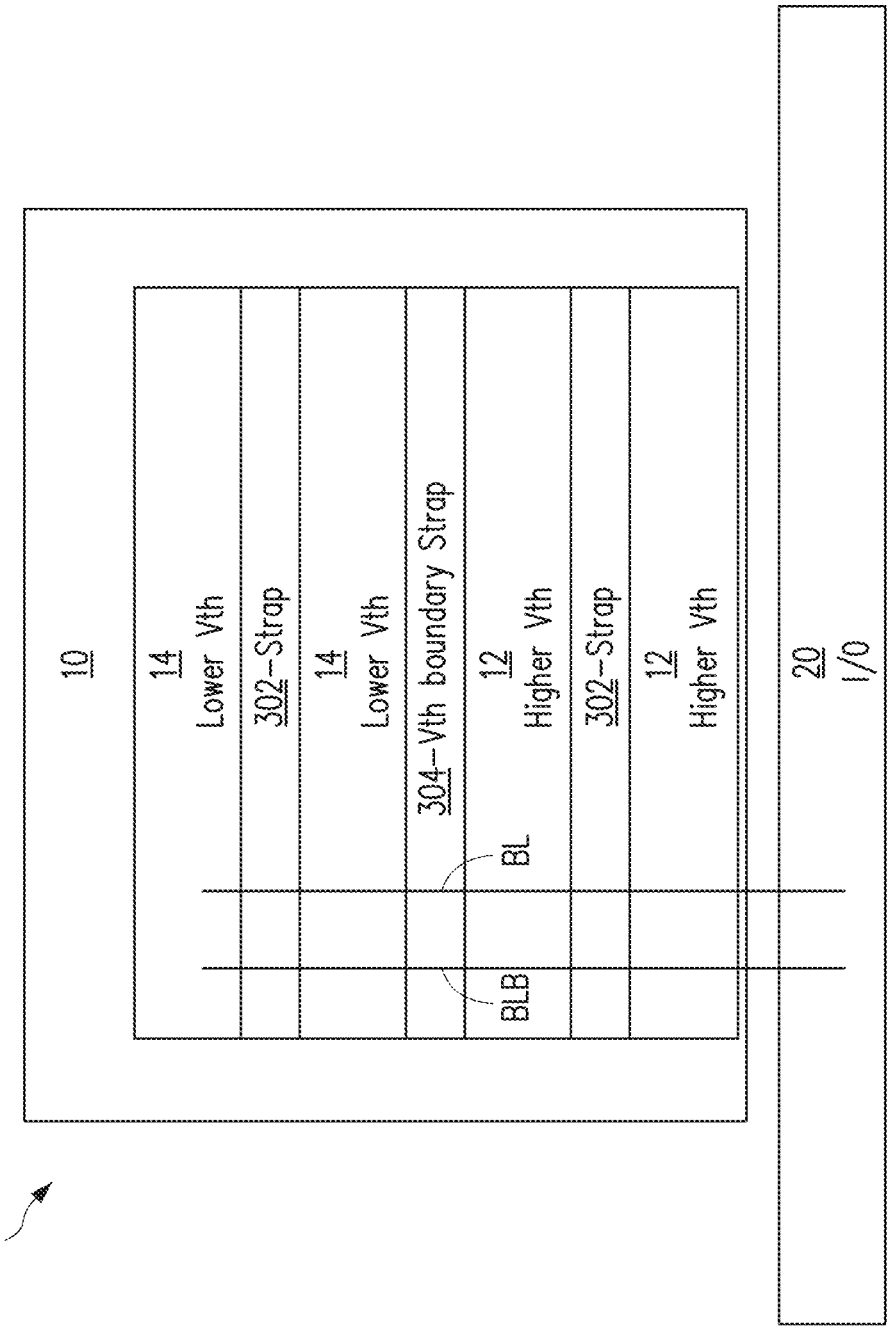
FIG. 3 is a block diagram illustrating an example of a memory device with varying Vth in accordance with some embodiments.

FIG. 3 is a block diagram illustrating further aspects of an example of the memory device 1 with varying Vth. In the example shown, the memory device 1 includes the memory array 10 and the periphery region 20 including the I/O circuit located peripherally to memory array 10. The memory cells (not shown) and the I/O circuit may be coupled by complementary bit lines BL and BLB, and data can be read from and written to the memory cells via the complementary bit lines BL and BLB, as described and illustrated above with respect to FIG. 1.

In the example shown, the memory array 10 includes a plurality of functional memory cell arrays 12. Each of the arrays 12 include memory cells having a first Vth. The memory array 10 also includes a plurality of functional memory cell arrays 14, each of which include memory cells having a second Vth that is lower than the first Vth. In other words, the memory cell arrays 12 can be referred to as the "higher Vth" arrays 12, and the memory cell arrays 14 can be referred to as the "lower Vth" arrays 14. In some examples, the higher Vth arrays 12 include pass gate transistors M5, M6 (shown in FIG. 2) with the first (higher) Vth, while the lower Vth arrays 14 include pass gate transistors M5, M6 with the second (lower) Vth. In other examples, additional transistors of the memory cells or transistors other than the pass gate transistors M5, M6 define the higher and lower Vth.

In the embodiment shown, each of the higher Vth arrays 12 are separated from each other by straps 302, and each of the lower Vth arrays 14 are separated from each other by straps 302. In the embodiment shown, the higher Vth arrays 12 are arranged within the memory array 10 to be closer to the periphery region 20 than the lower Vth arrays 14. In the embodiment shown, a Vth boundary strap 304 separates the higher Vth arrays 12 from the lower Vth arrays 14.

In the embodiment shown, the memory array 10 includes memory cells having two different Vth, e.g. memory cells with a higher Vth within the higher Vth arrays 12 and memory cells with a lower Vth within the lower Vth arrays 14, arranged such that the memory cells with a higher Vth are closer to the I/O circuitry in the periphery region 20 and the memory cells with the lower Vth are farther from the I/O circuitry in the periphery 20 relative to the cells with the higher Vth.

Figure 4:
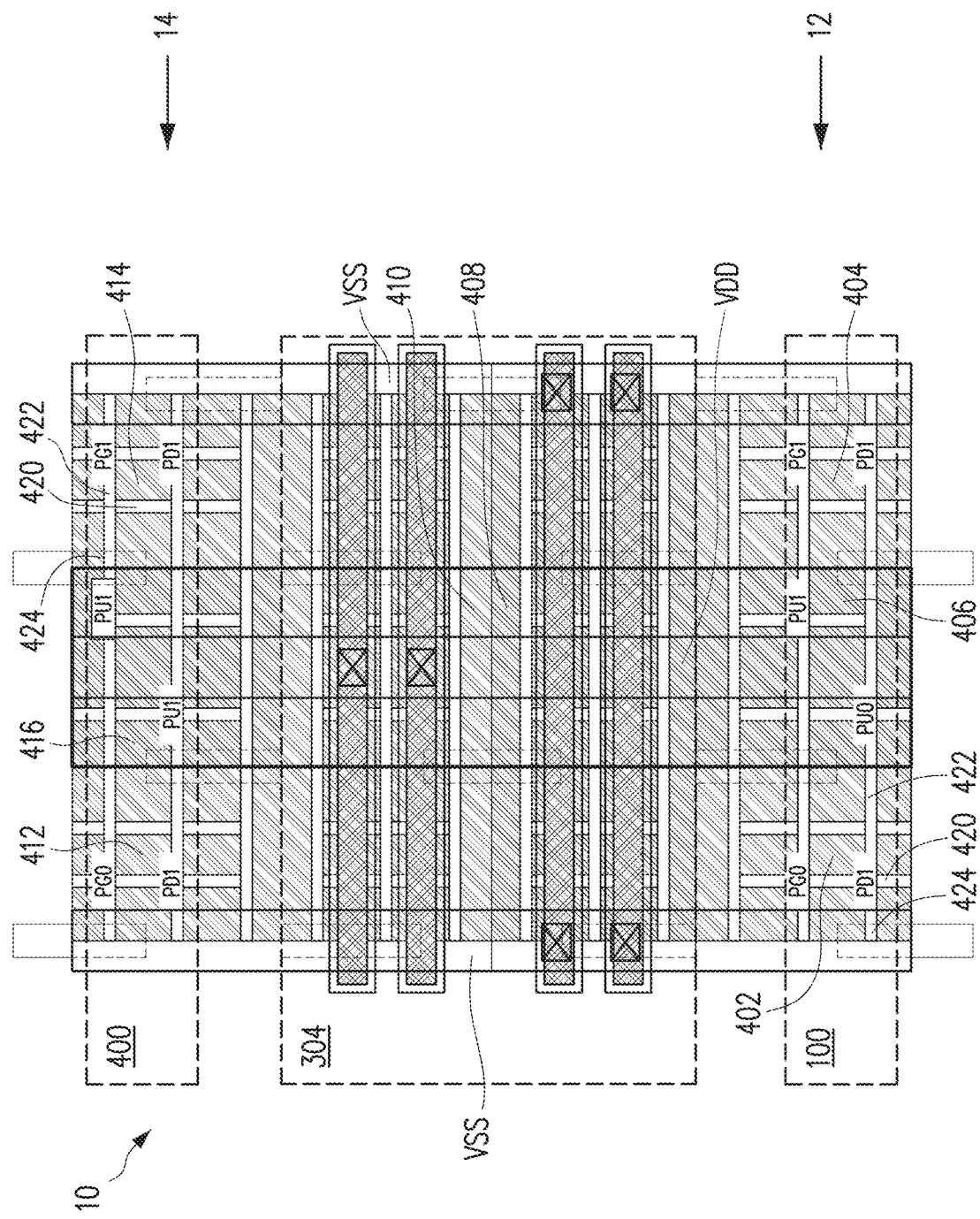
FIG. 4 is a layout diagram illustrating an example memory cell in accordance with some embodiments.

FIG. 4 is a layout diagram illustrating an example memory cell 10 in accordance with some embodiments. In the example shown, the memory array 10 includes a higher Vth memory array 12, a lower Vth memory array 14, and a Vth boundary strap 304. The embodiment illustrated in FIG. 4 also includes conductive lines VSS and VDD in an interconnect metal layer structure "above" the semiconductor structures described below, and connected to certain semiconductor structures by the vias 414.

In the embodiment shown, the higher Vth memory array 12 includes active region structures 420, polysilicon structures 422, and areas of cut or removed polysilicon 424. In some embodiments, the memory array 10 is formed by patterning the OD structures 420 and polysilicon structures 422 and forming connections in a repeated pattern to form the individual memory cells 100. In the embodiment shown, the NMOS gate transistor PG0 and the NMOS pull-down transistor PD0 in the region 402 have a "high NMOS" Vth. Similarly, the NMOS gate transistor PG1 and the NMOS pull-down transistor PD1 in the region 404 also have the "high NMOS" Vth. The pull-up transistors PU0 and PU1 in the region 406 have a "high PMOS" Vth. In some embodiments, the Vth of the transistors in the regions 402 and 404 have a higher Vth than the transistors in the area 406.

In the embodiment shown, the lower Vth memory array 14 includes active region structures 420, polysilicon structures 422, and areas of cut or removed polysilicon 424. In some embodiments, the memory array 10 is formed by patterning the OD structures 420 and polysilicon structures 422 and forming connections in a repeated pattern to form the individual memory cells 400. In the embodiment shown, the NMOS gate transistor PG0 and the NMOS pull-down transistor PD0 in the region 412 have a "low NMOS" Vth. Similarly, the NMOS gate transistor PG1 and the NMOS pull-down transistor PD1 in the region 414 also have the "low NMOS" Vth. The pull-up transistors PU0 and PU1 in the region 416 have a "low PMOS" Vth. In some embodiments, the Vth of the transistors in the regions 412 and 414 have a higher Vth than the transistors in the area 416. In the embodiment shown, the memory cell 400 is similar to the memory cell 100, the difference being that the Vth of the transistors of the memory cell 400 are correspondingly lower than their counterparts of the memory cell 100.

In some embodiments, the strap 304 can be used to provide a Vth transition from the memory cell 100 to the memory cell 400 in the memory array 10, and vice versa. For example, the doping of the OD structures in the region 408 results in a Vth that corresponds to the "high PMOS" Vth of the region 406 in the embodiment shown, which is lower than the "high NMOS" Vth of the regions 402 and 404. Further, in the embodiment shown, the doping of the OD structures in the region 410 results in a Vth that corresponds to the "low NMOS" Vth of the regions 412 and 414, which is lower than the "high PMOS" Vth of the region 408. As such, in the embodiment shown, the strap regions 408 and 410 step down the Vth of corresponding transistors from the higher Vth of the memory cell 100 to the lower Vth of the memory cell 400.

Figure 5:
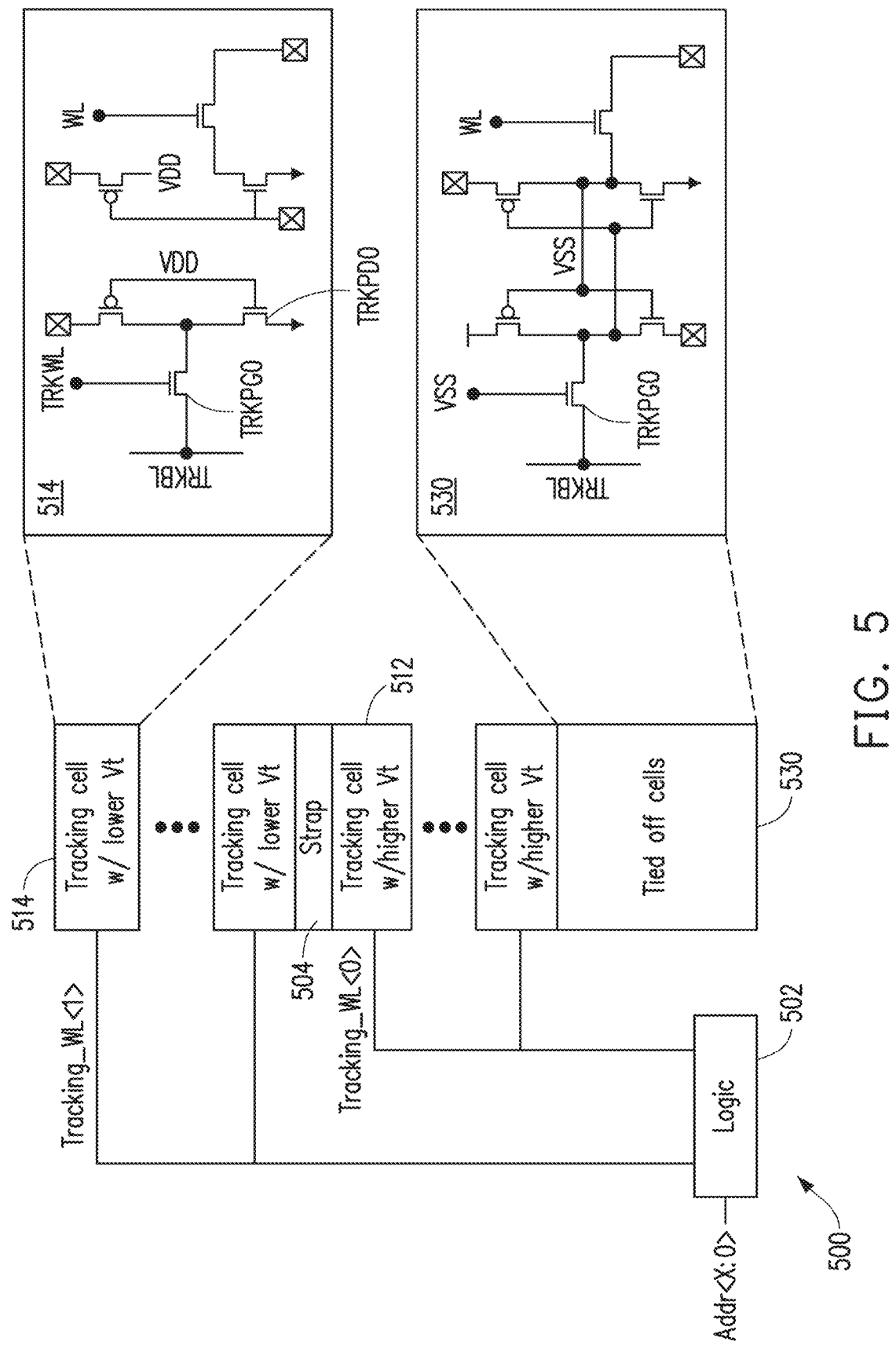
FIG. 5 is a block diagram illustrating an example of tracking cells in accordance with some embodiments.

FIG. 5 is a block diagram illustrating an example of tracking cells 500 with varying threshold voltage in accordance with some embodiments. The example shown in FIG. 5 includes low Vth tracking cells 514, tracking strap 504, high Vth tracking cells 512, and tied off cells 530. In general, tracking is a mechanism to imitate signals at different locations of a memory array, such as the memory array 10. In some embodiments, signals from the corners of a memory array relative to the I/O circuitry in the peripheral region 20 can be distorted. In some embodiments, the tracking cells 512, 514 may be used to detect the process corners of the memory cells 100, 400 for improved SA timing. For example, due to variations resulting from manufacturing processes used to form the memory cells 100, 400, the memory cells 100, 400 may operate slower or faster particularly in different operating environments (e.g., different temperatures, voltages, and/or the like). In some embodiments, the tracking cells 512, 514 may be included in the memory array 10 in order to track the timing effects of such process corners.

In the embodiment shown, the tracking cells 514 include transistors that mimic the lower Vth of the corresponding memory cells 400. The tracking cells 512 include transistors that mimic the higher Vth of the corresponding memory cells 100. The tracking strap 504 separates the lower Vth tracking cells 514 from the higher Vth tracking cells 512, and can provide a Vth transition between the lower and higher Vth of the tracking cells 500.

In some examples, the tracking cells 500 includes the logic 502. In some embodiments, the logic 502 determines the address of a memory cell 100, 400 being accessed, and activates the corresponding tracking cell 512, 514 via the tracking word line. For example, when a memory cell 100 is accessed, the corresponding tracking cell 512 is activated via the tracking word line. In some embodiments, a voltage is applied to the tracking bit line TRKBL, and the time to discharge the tracking bit line TRKBL through the gate transistor TRKPG0 and the tracking NMOS pull-down transistor TRKPD0 is measured. In some embodiments, the tracking cells 514, 512 are located in the memory array 10 and include transistors formed along with the memory cells 100, 400, but are connected as illustrated in FIG. 5.

In the example of FIG. 5, the tracking cells 500 include the tied-off cells 530. In some examples, the tied-off cells may be used as an isolation device in which the active area of the tie-off device is set to an off state. In other words, a gate of such a device may be biased in an OFF state and provide isolation for another device. Further, the gate of the gate transistor TRKPG0 is connected to VSS shutting access to the tracking bit line TRKBL off in the tied-off cells 530. In some embodiments, the tied-off cells 530 are included as dummy spacer cells that are disabled to reduce power consumption for memory cells near the I/O circuitry for which tracking is less critical and therefore not implemented.

Figure 6:
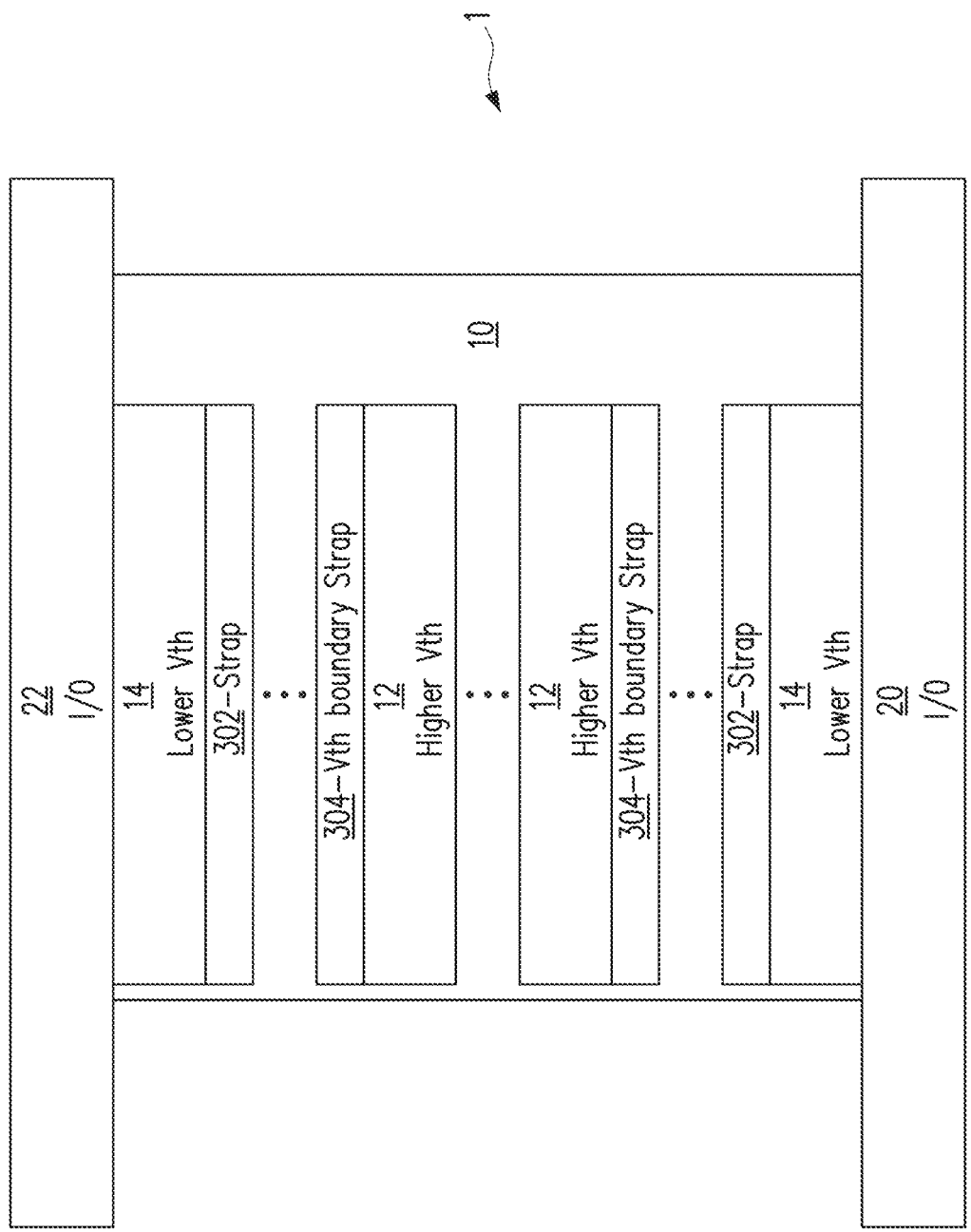
FIG. 6 is a block diagram illustrating another example of a memory device with varying Vth in accordance with some embodiments

FIG. 6 is a block diagram illustrating an example of a memory device 1 with varying Vth in accordance with some embodiments. The example shown in FIG. 6 illustrates an embodiment that can used with dual port memory cells 100, 400, which can be accessed by two different sets of I/O circuitry. In the example shown, the memory device 1 includes a memory array 10, a first periphery region 20 located along the one peripheral edge of the memory array 10 in the example shown, and a second periphery region 22 located along a different peripheral edge of the memory array 10, e.g. the edge of the memory array 10 opposite the first periphery region 20 in the example shown. The first and second periphery regions 20, 22 include respective periphery circuits including I/O circuits. The memory cells (not shown) and the periphery I/O circuits of both the periphery regions 20, 22 may be coupled by two sets of complementary bit lines, and data can read from and written to the memory cells via the complementary bit lines by either or both of the I/O circuitry in the periphery regions 20, 22.

In the example of FIG. 6, the memory array 10 includes a plurality of functional memory cell arrays 12. Each of the arrays 12 include memory cells having a first Vth. The memory array 10 also includes a plurality of functional memory cell arrays 14, each of which include memory cells having a second Vth that is lower than the first Vth. In the embodiment shown, each of the higher Vth arrays 12 are separated from each other by straps 302, and each of the lower Vth arrays 14 are separated from each other by straps 302. In the embodiment shown, the higher Vth arrays 12 are arranged within the memory array 10 to be in the center of the memory array 10 relative to the two periphery regions 20, 22, and the lower Vth arrays 14 are arranged within the memory array 10 to be nearer to the periphery regions 20, 22. In the embodiment shown, two Vth boundary straps 304 separates the higher Vth arrays 12 from the lower Vth arrays 14 corresponding to the two transitions between lower and higher Vth.

In the embodiment shown, the higher Vth arrays 12 are arranged in the center of the memory array 10 for lower current leakage, and the lower Vth arrays 14 are arranged at the edges of the memory array 10 for improved write performance, e.g. write margin.

Figure 7:
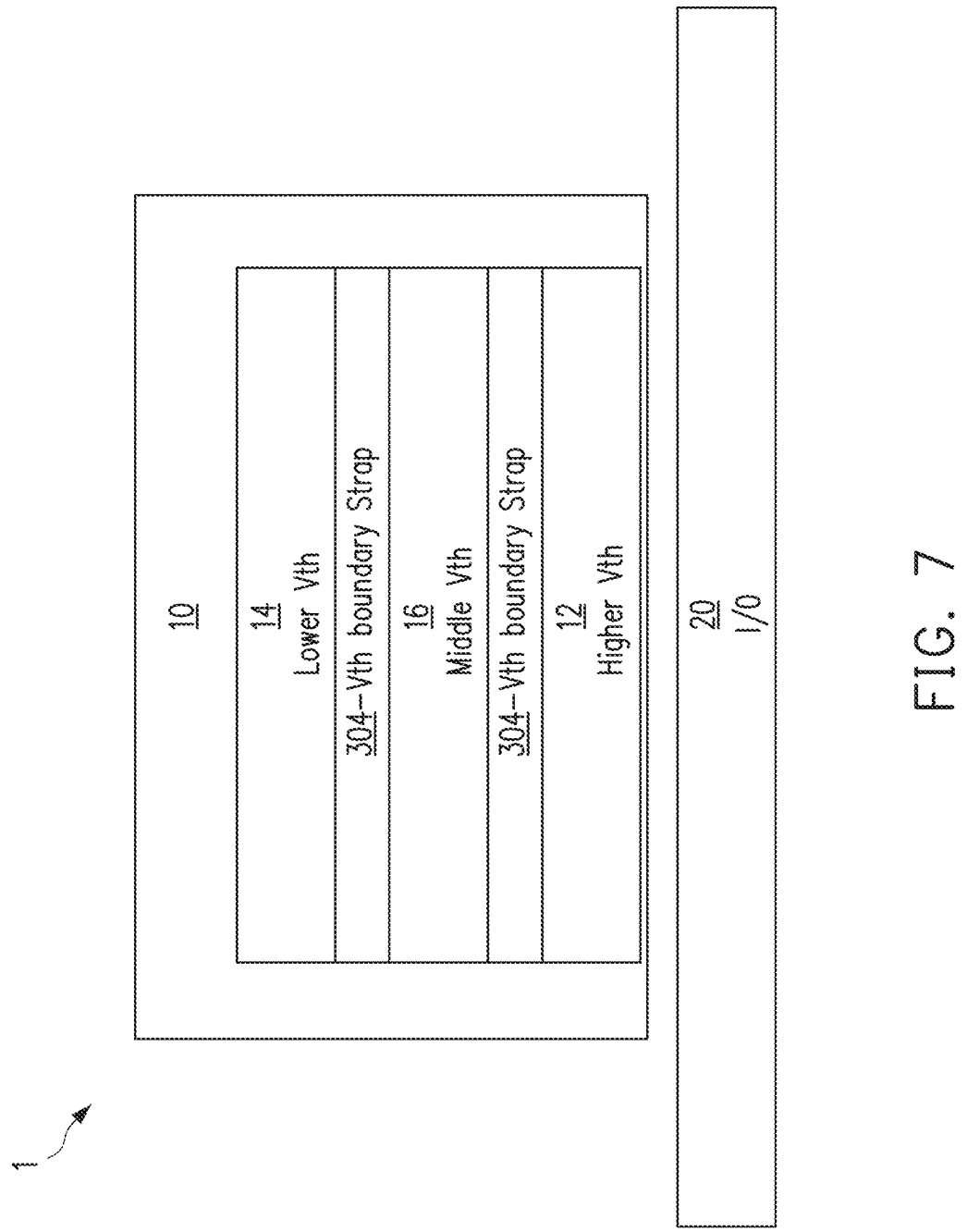
FIG. 7 is a block diagram illustrating a further example of a memory device with varying Vth in accordance with some embodiments

FIG. 7 is a block diagram illustrating another example of a memory device 1 with varying Vth in accordance with some embodiments. In the example shown, the memory device 1 includes a memory array 10 and a periphery region 20 located peripherally to memory array 10 with periphery circuits including an I/O circuit.

In the example shown, the memory array 10 includes a plurality of functional memory cell arrays 12. Each of the arrays 12 include memory cells having a first Vth. The memory array 10 also includes a plurality of functional memory cell arrays 14, each of which include memory cells having a second Vth that is lower than the first Vth. The memory array 10 also includes a plurality of functional memory cell arrays 16, each of which include memory cells having a third Vth that is lower than the first Vth and higher than the second Vth. In other words, the memory cell arrays 16 can be referred to as the "middle Vth" arrays 16. In the embodiment shown, each of the higher Vth arrays 12, the middle Vth arrays 16, and the lower Vth arrays 14 are separated from each other by Vth boundary straps 304. In the embodiment shown, the higher Vth arrays 12 are arranged within the memory array 10 to be closer to the periphery region 20 than the middle Vth arrays 16, and the middle Vth arrays 16 are arranged to be closer to the periphery region 20 than the lower Vth arrays 14. In some embodiments, there are a plurality of middle Vth arrays 16 having a plurality of Vth levels arranged from highest to lowest with increasing distance from the periphery region 20.

Figure 8:
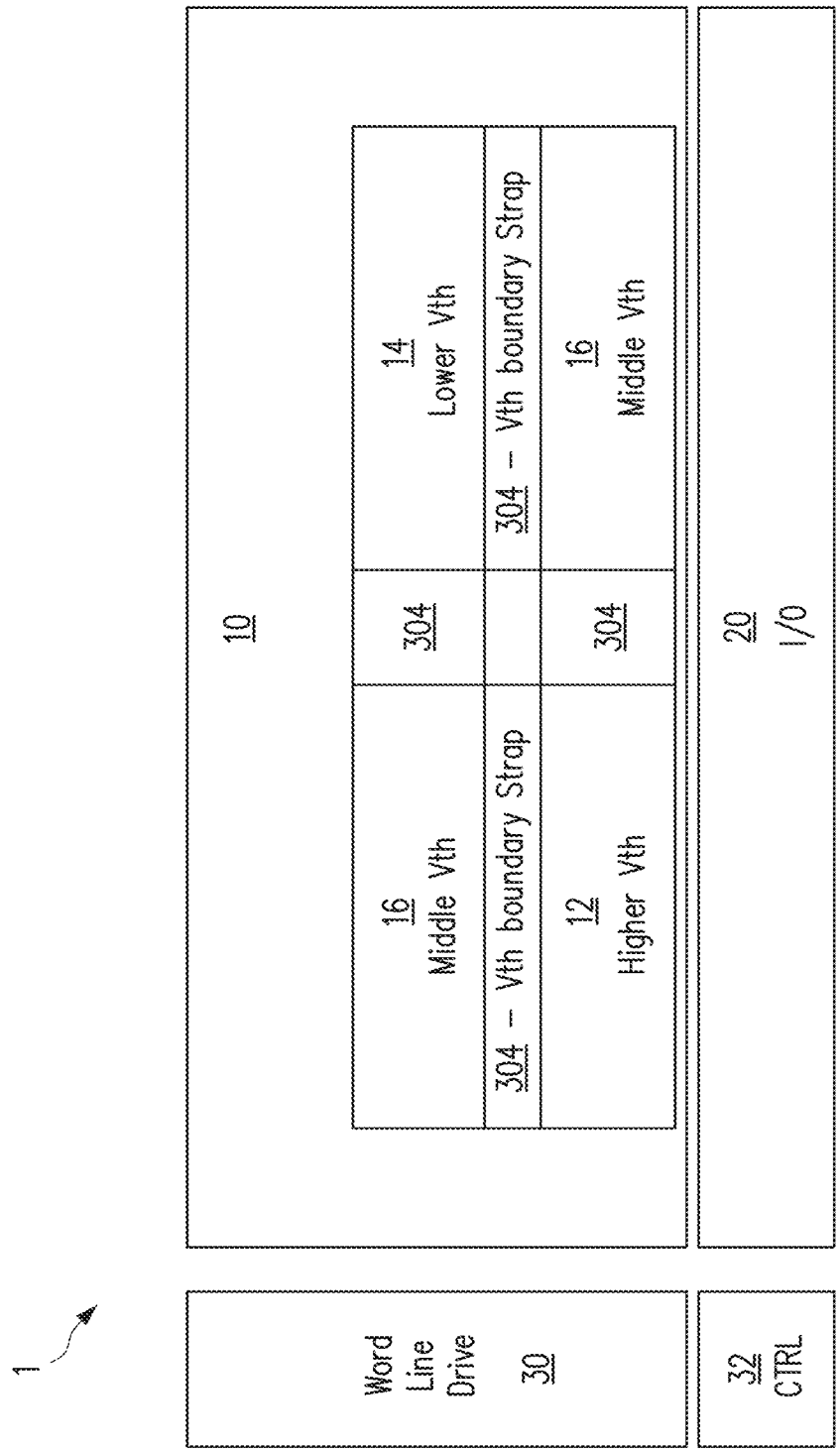
FIG. 8 is a block diagram illustrating another example of a memory device with varying Vth in accordance with some embodiments

FIG. 8 is a block diagram illustrating another example of a memory device 1 with varying Vth in accordance with some embodiments. In the example shown, the memory device 1 includes a memory array 10, a periphery region 20 located peripherally to memory array 10 along one edge, a periphery region 30 located peripherally to the memory array 10 and along an edge adjacent to the periphery region 20, and a control region 32 located adjacent to the periphery regions 20, 30. The periphery regions 20, 30 include respective periphery circuits such as the I/O circuit and a word line driver circuit 31.

In the example shown, the memory array 10 includes a plurality of functional memory cell arrays 12. Each of the arrays 12 include memory cells having a first Vth. The memory array 10 also includes a plurality of functional memory cell arrays 14, each of which include memory cells having a second Vth that is lower than the first Vth. The memory array 10 also includes a plurality of functional memory cell arrays 16, each of which include memory cells having a third Vth that is lower than the first Vth and higher than the second Vth. In the embodiment shown, each of the higher Vth arrays 12, the middle Vth arrays 16, and the lower Vth arrays 14 are separated from each other by Vth boundary straps 304. In the embodiment shown, the higher Vth arrays 12 are arranged within the memory array 10 to be closer to both the periphery region 20 and the periphery region 30, e.g. in the lower left corner of the memory array 10 as illustrated, than the middle Vth arrays 16 and the lower Vth arrays 14. The middle Vth arrays 16 are arranged to be farther away from both the periphery regions 20, 30 than the higher Vth arrays 12 and closer to both the periphery regions 20, 30 than the lower Vth arrays 14, and the lower Vth arrays 14 are arranged to be farthest away from the periphery regions 20, 30. While FIG. 8 illustrates a specific arrangement of functional memory arrays and associated Vth, other configurations are within the scope of the disclosure, including different combinations and structures of the functional arrays, varying Vth cells, cell locations, etc.

Figure 9:
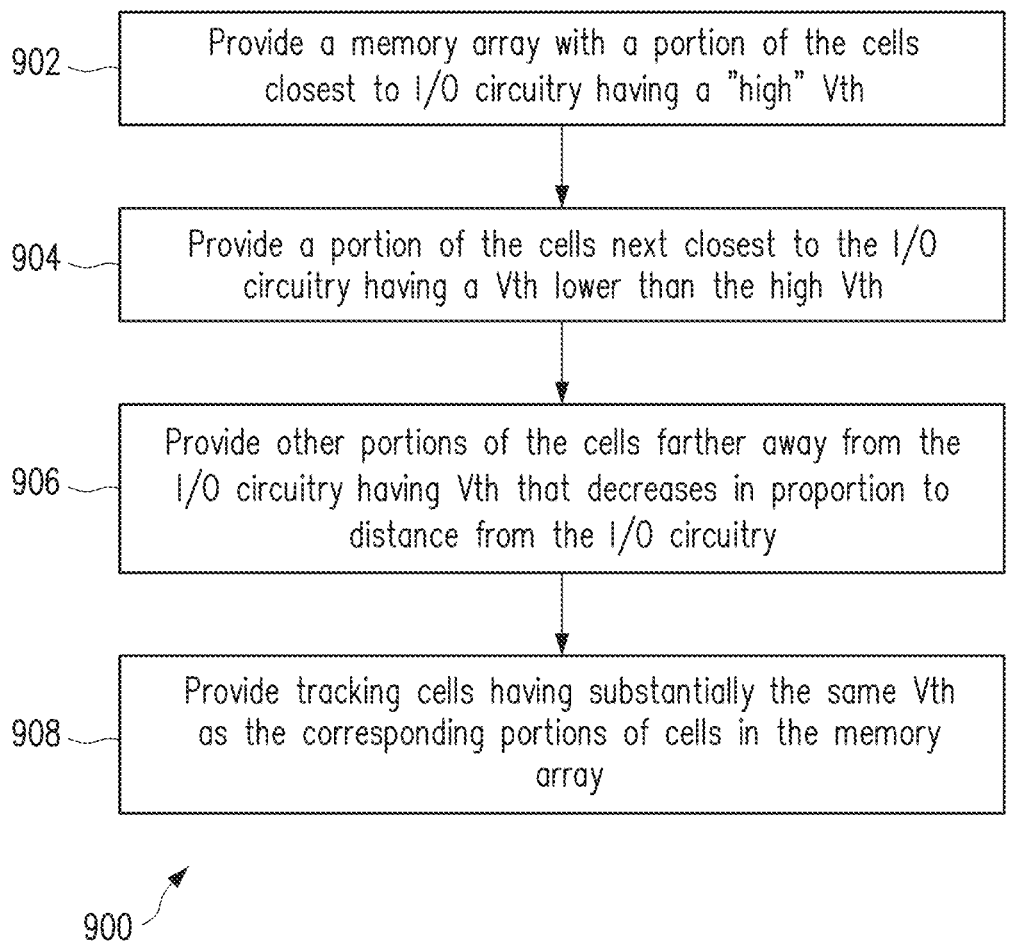
FIG. 9 is a flowchart of an example method in accordance with some embodiments

FIG. 9 is a flowchart of an example method 900 of forming a mixed threshold voltage memory array in accordance with some embodiments. Method 900 begins at step 902 in which a memory array is provided with a portion of the memory cells closest to I/O circuitry having a high Vth. For example, the memory 10 is formed having a higher Vth array 12 arranged closest to a periphery region 20 including I/O circuitry and connected to the cells in the higher Vth array 12, as illustrated in FIGS. 3, 6-8. At step 904, a second portion of memory cells of a memory array are provided with a lower Vth than the high Vth of the first portion of memory cells, the second portion being farther from the I/O circuitry than the first portion. For example, the memory 10 is formed having a lower Vth array 14 arranged farther from the periphery region 20, as illustrated in FIGS. 3, 6-8. At the step 906, other portions of the memory cell 10, such as the middle Vth arrays 16, can be formed such that the cells of the memory array 10 have Vth values that decrease with increasing distance from the periphery regions including the I/O circuitry that the cells are connected to, for example, the higher Vth arrays 12, the lower Vth arrays 14, and the middle Vth arrays 16 as illustrated in FIGS. 7-8. At the step 908, tracking cells having substantially the same Vth as the corresponding portions of memory cells in the memory array 10 are formed. For example, the tracking cells 500 as illustrated in FIG. 5.

By providing a memory array 10 with mixed threshold voltages Vth, improved write margin and read speed can be realized for memory cells arranged farther away from the I/O circuitry in a memory device, e.g. the memory device 1. In addition, the leakage current associated with lower Vth can be reduced.

Thus, disclosed embodiments include a SRAM device including a first memory array including a plurality of memory cells, each memory cell including a first pass gate transistor with a first threshold voltage connected to a bit line. The SRAM device further includes a second memory array including a plurality of memory cells, each memory cell including a second pass gate transistor with a second threshold voltage connected to the bit line. The SRAM device further includes a peripheral input-output circuit connected to the bit line, wherein the first memory array is between the peripheral input-output circuit and the second memory array.

In accordance with other disclosed embodiments, a SRAM device includes a first memory array including a plurality of memory cells, each memory cell having a first threshold voltage connected to a bit line. The SRAM device further includes a second memory array including a plurality of memory cells, each memory cell having a second threshold voltage connected to the bit line. The SRAM device further includes a peripheral input-output circuit connected to the bit line. The SRAM device still further includes a column of write current tracking cells, each tracking cell disposed within a row of the first memory array and the second memory array, wherein the first memory array is between the peripheral input-output circuit and the second memory array.

In accordance with still further disclosed embodiments, method of forming a SRAM device includes providing a first memory array including a plurality of memory cells, each memory cell including a first pass gate transistor with a first threshold voltage. The method further includes providing a second memory array including a plurality of memory cells, each memory cell including a second pass gate transistor with a second threshold voltage. The method further includes coupling the first pass gate transistor to a bit line and coupling the second pass gate transistor to the bit line and coupling a peripheral input-output (I/O) circuit to the bit line, wherein the first memory array is between the peripheral input-output circuit and the second memory array.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) device, comprising:
   a first memory array including a plurality of memory cells, each memory cell including a first pass gate transistor with a first threshold voltage connected to a bit line;
   a second memory array including a plurality of memory cells, each memory cell including a second pass gate transistor with a second threshold voltage connected to the bit line; and
   a peripheral input-output (I/O) circuit connected to the bit line;
   wherein the first memory array is between the peripheral input-output circuit and the second memory array.

2. The SRAM device of claim 1, wherein the first threshold voltage is greater than the second threshold voltage.

3. The SRAM device of claim 2, wherein a strap cell separates the first memory array from the second memory array.

4. The SRAM device of claim 3, wherein the first memory array includes a first sub-array and a second sub-array separated from the first sub-array by a strap cell, wherein the second memory array includes a third sub-array and a fourth sub-array separated from the third sub-array by a strap cell.

5. The SRAM device of claim 3, further comprising:
   a column of write current tracking cells, each tracking cell disposed within a row of the first memory array and the second memory array.

6. The SRAM device of claim 5, wherein the tracking cells disposed within the first memory array have a first tracking threshold voltage and the tracking cells disposed within the second memory array have a second tracking threshold voltage.

7. The SRAM device of claim 6, wherein the first tracking threshold voltage is greater than the second tracking threshold voltage.

8. The SRAM device of claim 1, further comprising:
   a third memory array including a plurality of memory cells, each memory cell including a third pass gate transistor with a third threshold voltage connected to the bit line;
   wherein the first memory array and the second memory array are between the peripheral I/O circuit and the third memory array.

9. The SRAM device of claim 8, wherein the first threshold voltage is greater than the second threshold voltage, and the second threshold voltage is greater than the third threshold voltage.

10. The SRAM device of claim 8, further comprising:
    a second peripheral I/O circuit connected to a second bit line, wherein the first memory array, the second memory array, and the third memory array are between the peripheral I/O circuit and the second peripheral I/O circuit;
    wherein each memory cell of the first memory array includes a fourth pass gate transistor with the first threshold voltage connected to the second bit line;
    wherein each memory cell of the second memory array includes a fifth pass gate transistor with the second threshold voltage connected to the second bit line;
    wherein each memory cell of the third memory array includes a sixth pass gate transistor with the third threshold voltage connected to the second bit line;
    wherein the second threshold voltage is greater than the first threshold voltage and the third threshold voltage.

11. The SRAM device of claim 1, further comprising:
    a third memory array including a plurality of memory cells, each memory cell including a third pass gate transistor with the second threshold voltage connected to the bit line;
    a fourth memory array including a plurality of memory cells, each memory cell including a fourth pass gate transistor with a third threshold voltage connected to the bit line;
    a peripheral word line driver circuit adjacent to both the first memory array and the second memory array;
    wherein the first memory array is between the fourth memory array and the peripheral word line driver circuit, the second memory array is between the third memory array and the peripheral word line driver circuit, and the third memory array is between the fourth memory array and the peripheral I/O circuit;
    wherein the first threshold voltage is greater than the second threshold voltage, and the second threshold voltage is greater than the third threshold voltage.

12. A static random access memory (SRAM) device, comprising:
    a first memory array including a plurality of memory cells connected to a bit line, each of the plurality of memory cells having a first threshold voltage;
    a second memory array including a plurality of memory cells connected to the bit line, each of the plurality of memory cells having a second threshold voltage;
    a peripheral input-output (I/O) circuit connected to the bit line;
    a column of write current tracking cells, each tracking cell disposed within a row of the first memory array and the second memory array;
    wherein the first memory array is between the peripheral input-output circuit and the second memory array.

13. The SRAM device of claim 12, wherein the tracking cells disposed within the first memory array have a first tracking threshold voltage and the tracking cells disposed within the second memory array have a second tracking threshold voltage.

14. The SRAM device of claim 13, wherein the first tracking threshold voltage is greater than the second tracking threshold voltage.

15. The SRAM device of claim 12, wherein
each of the plurality of memory cells of the first memory array includes a first pass gate transistor connected to the bit line, each of the first pass gate transistors having the first threshold voltage;
each of the plurality of memory cells of the second memory array includes a second pass gate transistor connected to the bit line, each of the second pass gate transistors having the second threshold voltage.

16. A method of forming a static random access memory (SRAM) device, comprising:
providing a first memory array including a plurality of memory cells, each memory cell including a first pass gate transistor with a first threshold voltage;
providing a second memory array including a plurality of memory cells, each memory cell including a second pass gate transistor with a second threshold voltage;
coupling the first pass gate transistor to a bit line and coupling the second pass gate transistor to the bit line;
coupling a peripheral input-output (I/O) circuit to the bit line, wherein the first memory array is between the peripheral input-output circuit and the second memory array; and
providing a column of write current tracking cells, the write current tracking cells including a first tracking cell disposed within a row of the first memory array and having a first tracking threshold voltage, and a second tracking cell disposed within a row of the second memory array and having a second tracking threshold voltage.

17. The method of claim 16, wherein the first threshold voltage is greater than the second threshold voltage.

18. The method of claim 17, further comprising:
providing a strap cell separating the first memory array from the second memory array.

19. The method of claim 17, further comprising:
providing a plurality of the first memory arrays;
separating the plurality of the first memory arrays from one another by strap cells;
providing a plurality of the second memory arrays; and
separating the plurality of the second memory arrays from one another by strap cells.

20. The method of claim 16, wherein the first tracking threshold voltage is greater than the second tracking threshold voltage.

* * * * *